United States Patent
Perner

(10) Patent No.: US 7,203,265 B2
(45) Date of Patent: Apr. 10, 2007

(54) SYNCHRONOUS COUNTING CIRCUIT

(75) Inventor: Frederick A. Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 177 days.

(21) Appl. No.: 11/155,523

(22) Filed: Jun. 16, 2005

(65) Prior Publication Data

US 2006/0288059 A1    Dec. 21, 2006

(51) Int. Cl.
*H03K 23/00* (2006.01)
*G06M 3/00* (2006.01)

(52) U.S. Cl. .............................. 377/118; 377/52; 377/54

(58) Field of Classification Search .................. None
See application file for complete search history.

(56) References Cited

U.S. PATENT DOCUMENTS

| | | | | |
|---|---|---|---|---|
| 4,958,274 A | * | 9/1990 | Dutton et al. | 713/600 |
| 5,394,450 A | * | 2/1995 | Pasternak | 377/49 |
| 2004/0181556 A1 | * | 9/2004 | Ko et al. | 707/200 |

* cited by examiner

*Primary Examiner*—Tuan Lam

(57) ABSTRACT

A M by N bit synchronous counter for use in advanced applications is provided. The M by N bit synchronous counter comprises an M by N register configured to receive and store data corresponding to at least one word integrated with a N bit counter configured to sequentially count out a selected word of data from the M by N register. The present design replaces a single counter latch circuit with a plurality or stack of selectable latches and employs combined load/store logic and counter controls.

22 Claims, 3 Drawing Sheets

SYNCHRONOUS COUNTING CIRCUIT

BACKGROUND OF THE INVENTION

1. Field of the Invention

The present invention relates generally to the field of counting devices, and more particularly to counting devices employed to control large numbers of independent circuits.

2. Description of the Related Art

Certain devices contain large blocks of controllable independent circuits. For example, magnetic random access memory (MRAM) circuits can include large arrays of independent circuits all requiring precision control. Control of large blocks or arrays of circuits has typically been difficult, and an efficient system for providing rapid circuit control for such an array has been generally unavailable.

Circuits with a large number arrays have employed counters to provide control over large arrays of independent circuits. Such counters may be employed with at least one register file and typically employ Load and Store circuits. Load and Store circuits, as the name implies, load data from a register into a counter and store data from the counter back into the register. The problem has been one of capacity, in that one Load and Store circuit can load and store information for one independent circuit block. If additional independent circuit blocks are used, a larger register is employed, but more significantly, multiple Load and Store circuits must be used to effectuate control over all circuits operating independently. Use of more circuits can be problematic, as they take up space and require significant power to effectively control the array of independent circuits.

Advanced applications, such as MRAM applications, cannot tolerate significant power consumption or the high costs associated with inefficient circuit layout. In order to provide more efficiency for applications employing multiple counting functions, multiple counters have been employed in parallel. Each counter holds its own state in this arrangement without the need for separate storage registers. However, such a design may be impractical for large blocks of independent circuits, such as M by N arrays, where M and N are greater than two. In this type of design, obtaining the state of the counter and providing that state to its independent circuit can present various problems, including but not limited to timing and throughput. Simply put, a large array of circuits cannot quickly and efficiently receive large amounts of control data states from a large array of control circuits holding individual circuit state information.

It would be advantageous to provide a counter or counting device able to quickly and efficiently provide control states to a set of M by N independent circuits, where the counter or counting device tends to result in generally improved performance.

SUMMARY OF THE INVENTION

According to a first aspect of the present design, there is provided an integrated M by N bit counter. The M by N bit counter comprises an M by N register configured to receive and store data corresponding to at least one word. The M by N register is configured to receive a set of M selectable words. The M by N counter further comprises a N bit counter configured to sequentially count out a selected word of data from the M by N register, and a control mechanism configured to include each 1 bit register contained in each selected word of the set of M selectable words stored in the M by N register into the N bit counter, thereby forming the integrated M by N counter.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

Figure 1:
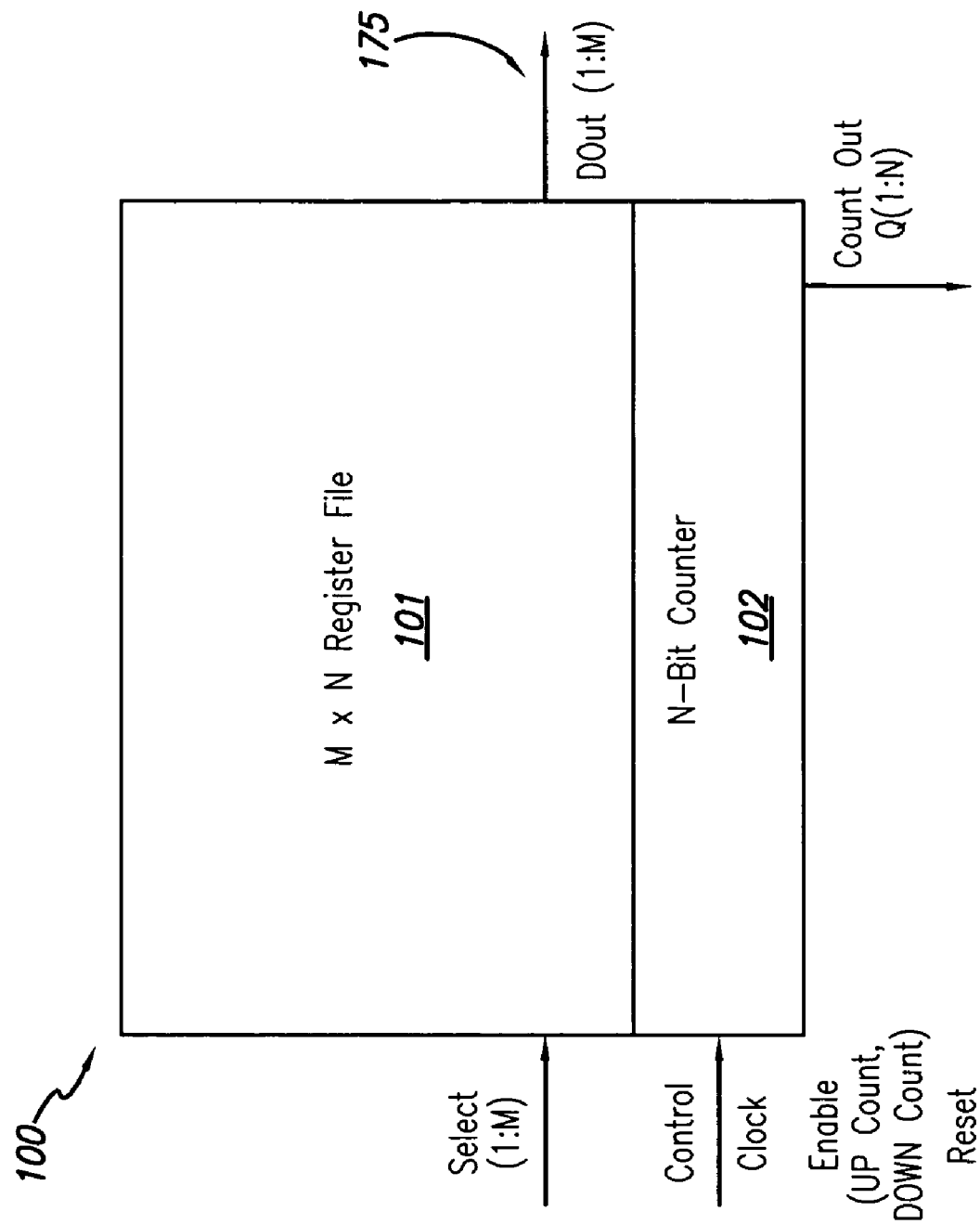
FIG. 1 provides a general illustration of a M by N register file integrated with a N bit counter in accordance with an embodiment of the present design.

The present invention is an M word storage register integrated with an N bit counter to form an M by N bit counter or counting device. FIG. 1 shows an overall view of the device used herein, namely an integrated M by N register file and N bit counter 100, where M by N register file 101 is merged with N-bit counter 102. As shown, M by N register file 101 receives a select signal, namely a 1 by M bit data line used to select 1 of M words from the M by N register 101. N bit counter 102 receives a control signal and a clock signal, where control includes enable commands, such as up count and down count, and a reset signal, as well as clock signals. The N-bit counter further provides a count out signal, representing 1 by M state elements selected using both the M by N register file 101 and the N bit counter 102. Area, performance, and power efficiencies are gained by physically sharing registers contained in the M by N register file 101 with the registers contained in the N bit counter 102.

The present design physically integrates the data storage registers of each word contained in the stack of M words, each M word being N bits wide, into a N bit counter. The present design provides significant area savings because only one counter configuration is used to perform M independent counts and the registers required in the counter circuit are eliminated by sharing the registers required to store each bit of data in each of the M words. Further, power is saved and performance is improved by eliminating the transfer of data to and from separate register and counter circuits using the present design. In operation, the counter registers and the M word storage registers of the present design are the same, thereby providing the enumerated benefits.

In operation, the select line selects a line of independent register circuits to be controlled in an M by N array, where the selected line or word is 1 of M words. The line of independent register circuits corresponds to a line of control states in the M by N register file. The N bit counter then uses control signals and a clock to alter the state of any of the control states in the selected row or word, and provides the states of the selected row or word out of the counter in a 1 by M array of control values. The designation Q in this context, specifically the count out provided being Q(1:N), represents the control states provided to the M by N array of independent circuits (not shown).

For example, if M is equal to 3 and N is equal to 10, the select line to M by N register file 101 provides a selection indication for one of the three rows. If, for example, the second row is desired, the select signal will be (0, 1, 0). The registers of the second row of control words being selected from the M by N register file 101 are connected to the N-bit counter 102 to "count out" the states, where the states may change depending on the timing of the control desired. For example, assuming the 10 bit word received from the M by N register file 101, Q(1) through Q(10), requires that states Q(3) and Q(8) increment to a higher current value, the N-bit counter 102 so increments those values through a process of synchronous counting. The net result, Q(1) through Q(10), including Q(3)' and Q(8)', are states in the N-bit counter 102 and are also the changed states in the selected row in the M by N register file 101.

The present design is particularly applicable to advanced applications, such as MRAM circuits, or more specifically, MRAM adaptive write circuits. Certain MRAM adaptive write circuits can contain digital data necessary to control currents used to write MRAM data states. The value of the write currents may be selected using UP/DOWN counters and digital-to-analog controlled current sources as part of a feedback control loop in adaptive current generators, generally known to those skilled in the art. An MRAM memory may contain many independent MRAM memory array blocks, each with write currents set up using an adaptive write current generator containing an UP/DOWN counter and a storage register to store the state of the write current for each MRAM array block. For example, an MRAM array block may be configured for multiple planes and/or multiple region operation. Each plane and/or region may have different current requirements, via a different stored digital signal control word, that requires setting up the current digital to analog converter by loading a stored digital control word into the registers of the current digital to analog converter. The current digital to analog converter in this MRAM arrangement may be configured as an UP/DOWN counter enabling the current digital to analog converter to incrementally step up and step down output current according to a digitally controlled feedback control circuit. Loading and storing digital control words to and from an UP/DOWN counter is thus addressed by the current design.

The current design thus provides a set of selectable latches rather than a single counter latch. The selectable latches form a storage register having properties similar to an SRAM memory. Selection of a word in the storage register entails asserting one select line in a manner similar to asserting a word line in SRAM. The selected storage cell may comprise a latch circuit similar to latch circuits employed in one bit counter cells. A load/store control signal connects the latch circuit contained in the storage register or storage cell to the counter circuit. Once the selected storage cell connects to the counter or counter circuit, the counter switches from a load/store mode to a counter mode, where the storage cell forms part of the counter changing state according to the rules of the counter. Once the count is completed, the storage cell may be de-selected, thus storing the final state of the counter. This arrangement can operate with any general counter circuit where the state of the count can be stored within the counter cells.

Figure 2:
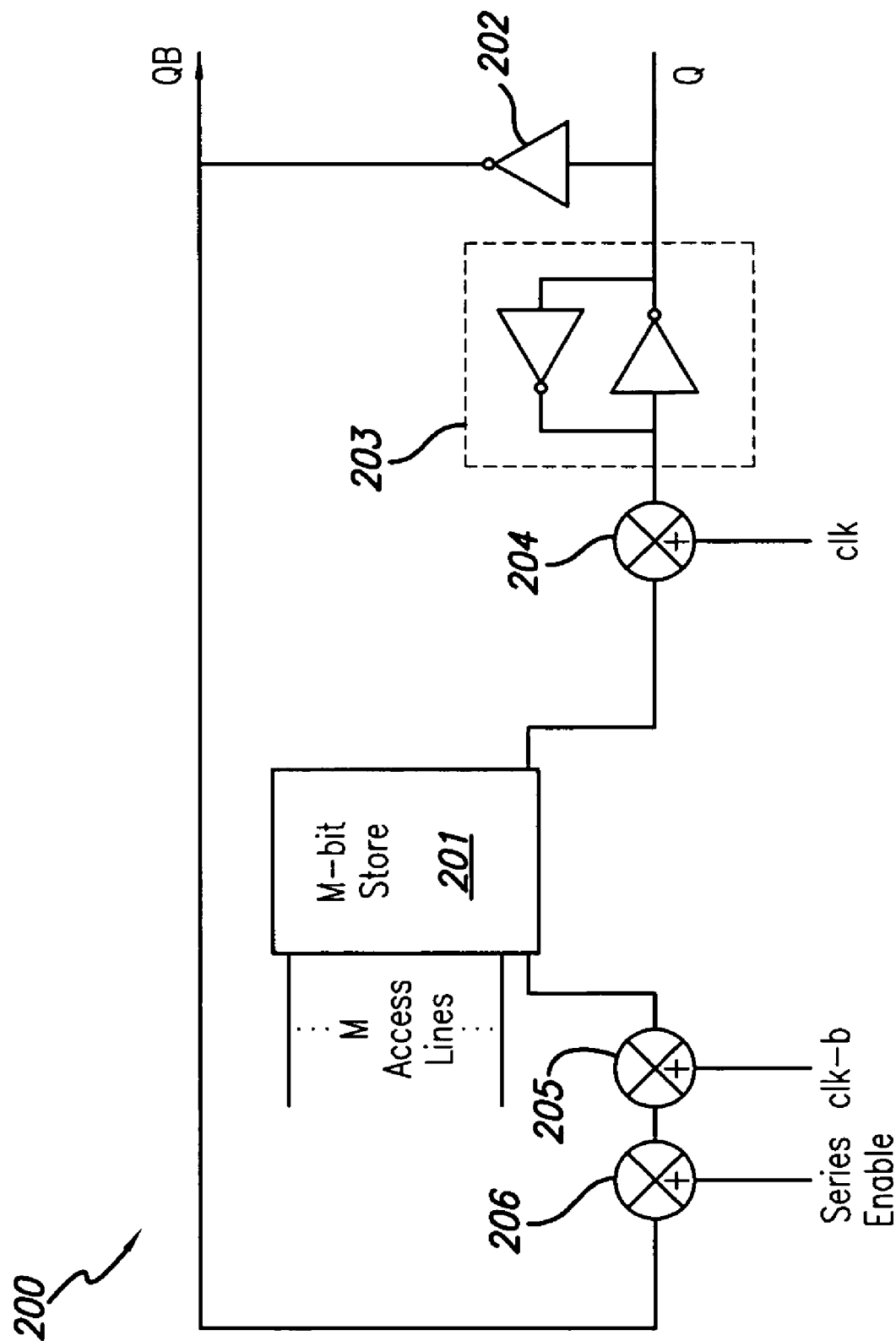
FIG. 2 is a one bit, M word series enabled synchronous counter.

FIG. 2 illustrates an M by 1 bit counter 200 in accordance with the present design, also known as an M by 1 bit counter circuit or simply counter circuit. M by 1 or M by 1 bit counter 200 is a one bit, M word, series enabled, synchronous counter comprising an M-bit store 201 having M access lines feeding the synchronous counter. The Q and QB signals represents the state of the N by 1 bit counter 200 and the inverse state of M by 1 bit counter 200, respectively. The state of the M by 1 bit counter cell is provided after the circuit selects one of M access lines. The circuit activates a load/store signal to connect the selected register to the transmission gates 204 and 205. After the system asserts the signal clk, the circuit latches the state of the selected register in the weak feedback counter latch 203 and the state is provided to the output Q. The circuit generates the inverse of Q, signal QB, through inverter 202 and provides signal QB as an output and as a feedback signal when needed by an external counter circuit (not shown). Transmission gates 205 and 206 complete the N by 1 bit counter circuit. The M by 1 bit counter 200 receives clock signal clk to load the state of the selected cell into the counter. The Series Enable signal enables the cell as a one bit counter cell, and the operation of signals clk and clk-b are controlled by an external clock (not shown) to operate the M by 1 bit counter 200 as a synchronous counter.

In operation, the control logic asserts a row select signal to select one of the M access lines shown in FIG. 2. The circuit then asserts a load/store signal to connect the storage register in the one of M registers in the M-bit store array 201. The external clock provides a first clock signal and a second clock signal to first supply the output Q from the M-bit store array 201 at a selected time. Control logic asserts the Signal Series Enable signal to activate the M by 1 bit counter 200 as a synchronous counter. The M by 1 bit counter 200 counts, or sequentially steps, between a high (HI) and low (LO) state whenever the clock signal clk and clk-b are pulsed by the external clock. The state of the counter represented by the signal Q, indicates to the M-bit store array 201 at the appointed clocked time the state stored in the M-bit store array 201. The first and second clock signals are provided by the control logic, indicating when data is to be incremented in the counter. Thus the design of FIG. 2 can both receive and transmit or share register file data. A word is selected based on the M lines provided and the storage register containing that selected word in the M-bit store array 201 is physically connected to provide one of two latches necessary to perform a synchronous counter function.

The synchronous counter alternates the state of the counter when the external clock pulses counter clock signal, clk and clk-b. When the external clock asserts the first clock signal, clk, data from the M-bit store array 201 is latched in the temporary data register 203, and the output from the selected bit is made available at output Q and QB. The M by 1 bit counter 200 is enabled as a synchronous counter cell when transmission gate 206 is enabled, i.e. when the control logic asserts the Series Enable signal. The second clock signal, clk-b, causes the state of the counter to change from HI to LO or LO to HI. The new state of the counter is stored in the register cell contained in the M-bit store array 201.

Thus assume that M is equal to 3 and the stored state is equal to data-0, A load/store signal connects data strorage register in word M, here word 3, into the counter circuit of the M by 1 bit counter circuit 200. The series enable signal is asserted to enable the M by 1 bit counter circuit 200 to operate as a synchronous counter cell. The external clock then asserts the clock signal clk and the state of the M bit storage array 201 is applied to the input of the weak feedback latch 203 with an output Q equal to data-1 and QB equal to data-0. Weak feedback latch 203 receives the value of data-0 and inverts the value received to data-1 using the lower inverter in weak feedback latch 203. The data-0 value is connected to the input of the weak feedback latch 203 with the clock signal, clk, and if the clock signal is data-1, the result will be indicated by a data-1 at output Q and data-0 at output QB.

When the external clock and control logic assert clock signal clk-b and Series Enable, respectively, the circuit connects signal QB to the input of the data storage register residing in word M, in this example word 3, and the state of the register in word 3 changes from data-0 to data-1. In this manner, the state of the register in word 3 is changed from a data-0 to a data-1 as part of a synchronous counting process when the value of clk changes from "asserted" to "non-asserted," or once the clk signal transitions from a value 1 to a value 0 and the clk-b signal transitions from value 0 to value 1.

Figure 3:
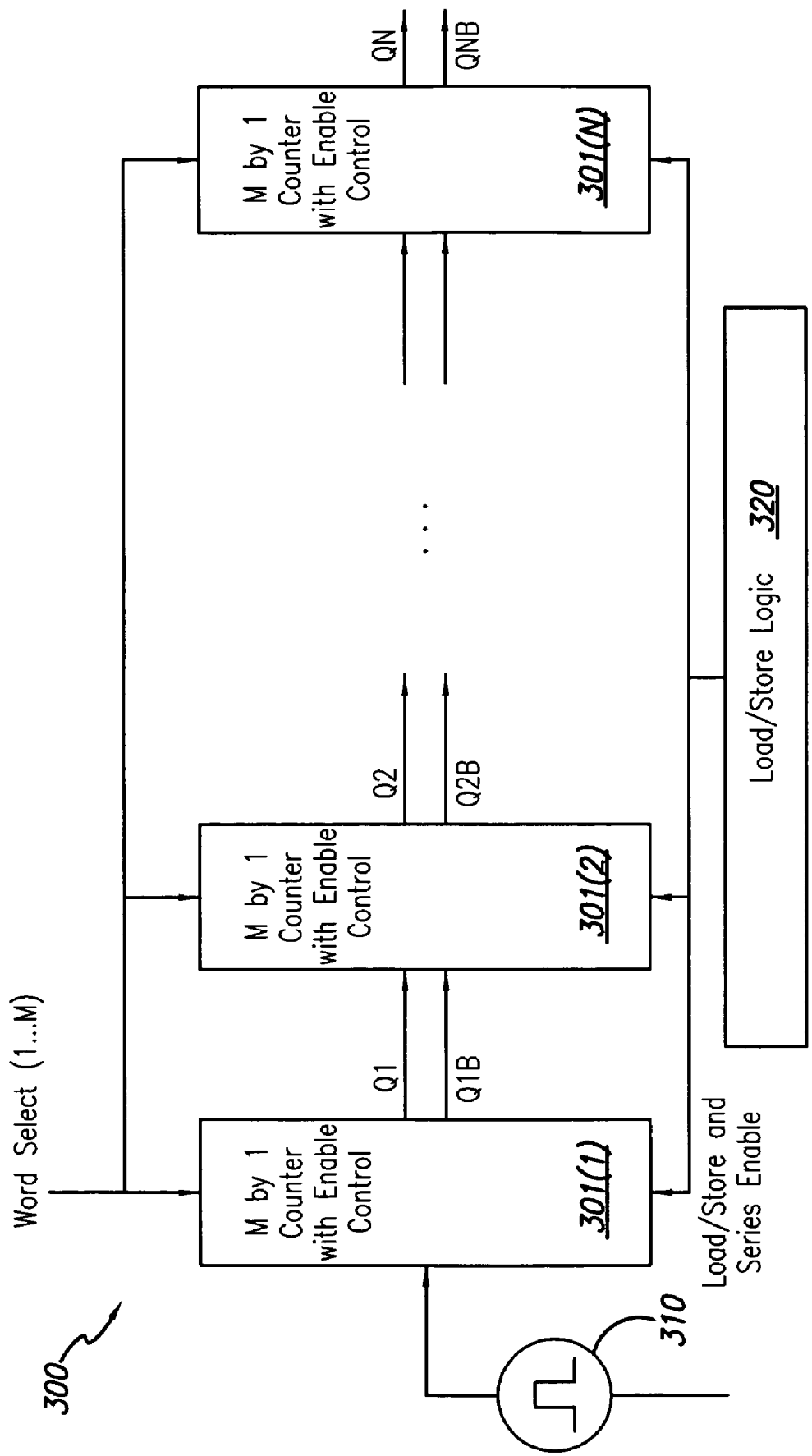
FIG. 3 is an M by N bit counter including a series of serially connected N by 1 bit counters with enable control in accordance with an embodiment of the present design.

FIG. 3 illustrates a more detailed diagram of the integrated M by N-bit counter 300, representing an M by N register file 101 integrated with an N bit counter 102. The illustration of FIG. 3 is similar to but in more detail than the conceptual illustration of FIG. 1. From FIG. 3, first M by 1 counter with enable control 301, or M by 1 counter, represents one M bit counter 200 of FIG. 2. As shown, the M by 1 counter 301(1) receives a count in signal from squarewave counter clock 310, as well as word select values from 1 to M and the two control signals from load/store logic 320. Based on the information provided, M by 1 counter 301 produces values Q1 and QB1 here, similar to Q and QB of FIG. 2, representing the state of the desired word and its inverse. Q1 and QB1 are presented to the clock inputs of the second M by 1 counter 301(2), which also receives the word select signal and an enable signal from the load/store logic 320. Second M by 1 counter 301(2) produces Q2 and QB2 as outputs. As shown, N M by 1 counters are available, 301(1) through 301(N), representing the number of elements in each row or word of data. The end result, Q(1:N), is the count out shown in FIG. 1 representing the result of the control signals and counter clock signals received by the M by N register file for controlling the circuit as a M word, N bit synchronous counter.

In operation, the design of FIG. 3 initially receives sequential count signals simply counting upward from time 0. This count signal is presented to M by 1 counter 301(1), which receives an initial counter state from one of M data registers and a control signal from the load/store logic 320. The circuit connected as a synchronous counter sequentially generates the clk and clk-b signals from the values of Q and QB, i.e., clk(n) equals Q(n−1) and clk-b(n) equals QB(n−1).

Control signals from load/store logic 320 configure the circuit 300 as a synchronous counter to control the state of the selected 1 of M words stored in the M by N register file and load the state of the selected word into the N bit counter. The state of the N bit counter is the data to be loaded or the data to be stored, as applicable, from the collection of M by 1 counters 301(1) through 301(N). The word selected is provided across the interface shown at the top of FIG. 3. For example, if M is 3, the third word may be the connected to the counter, and thus the value of 3 would be provided to all M by 1 counters 301(1) through 301(N), or the circuit becomes a counter for word M equal to 3. Thus in the present example, the value of 3 provided to each M by 1 counter 301(1) through 301(N) indicates the third entry is to be connected to each respective M by 1 counter. In this example, when the load/store and series enable signals are asserted, data registers from word 3 are connected to the N bit counter. Clock pulses clk and clk-b from the input clock 310 will cause the N bit counter to count the number of clock pulses as indicated by the change in state of the third word in this example in counters 301(1) through 301(N). If data is to be read out from the register file using the selected M by 1 counter, the third word select line from FIG. 2 is asserted along with the load/store signal. The clk signal and the stored data may then be read on output lines Q(1:N) by asserting the clock signal. If data is to be loaded into the register file using the selected M by 1 counter, the third word select line in this example may be asserted along with the load/store signal and the clk-b signal. The load data may then be supplied on output lines QB(1:N).

An alternative embodiment to using the counter ports Q and QB for loading and reading data into the M by N storage array is to configure the M by N storage array as a two-port SRAM array and use the second port for data I/O Such a construction is illustrated in FIG. 1 by dashed output line 175, where dashed line 175 represents DOut, or the output of the state of the data in the register file and forming the output of the second port of the SRAM array.

In a counter output arrangement, the overall output, Q1 . . . QN in FIG. 3, or Q(1:N) in FIG. 1, represents the one dimensional array of output data from all of the M by 1 counters 301(1) through 301(N) for one of M selected rows of data, and each row may function as an independent counter dependent on the 1 of M select signal, and signals from the load/store logic 320. Data passes from M by 1 counter 301(1) to M by 1 counter 301(2), and so on, with each M by 1 counter contributing its stored value. Thus a full word or row of data is counted out in one sequence, and 1 of M row select and the load/store logic 320 configures the counter for each row of data. In this manner, the entire array of data, namely the N columns of M rows of data, can be sequentially timed and read using the word selection and load/store logic 320.

As differentiated from previous designs, the present design affords the opportunity to provide an efficient physical layout than the combination of separate counter and register blocks. A design such as that presented may be employed in, for example, an MRAM with many adaptive write circuits where many digital to analog converters incrementally step up or step down values of output current to a digitally controlled feedback control circuit.

While the aforementioned and illustrated devices and methods for synchronous array counting for use in advanced applications, such as MRAM applications, has been described in connection with exemplary embodiments, those skilled in the art will understand that many modifications in light of these teachings are possible, and this application is intended to cover any variation thereof. Accordingly, any and all modifications, variations, or equivalent arrangements which may occur to those skilled in the art, should be considered to be within the scope of the present invention as defined in the appended claims.

What is claimed is:

1. An integrated M by N bit counter, comprising:
    an M by N register configured to receive and store data corresponding to at least one word, said M by N register configured to receive a set of M selectable words;
    a N bit counter configured to sequentially count out a selected word of data from the M by N register; and
    a control mechanism configured to include each 1 bit register contained in each selected word of the set of M selectable words stored in the M by N register into the N bit counter, thereby forming the integrated M by N counter.

2. The integrated M by N bit counter of claim 1, wherein the control mechanism combines all 1 bit registers of the N bit counter with the storage registers of each of the set of M selectable words stored in the M by N bit counter.

3. The integrated M by N bit counter of claim 1, wherein the N bit counter comprises at least one N-bit store element comprising one bit of an N-bit word, said store element configured to receive data over M access lines, wherein all the N-bit storage elements in an N-bit word form one of M words stored in the M by N register.

4. The integrated M by N bit counter of claim 3, wherein the N-bit counter further comprises at least one series enable signal and at least one clock signal to enable reading data from each N-bit store element.

5. The integrated M by N bit counter of claim 4, wherein the N-bit counter comprises a series combination of 1 bit registers contained in one of M words and each of the 1 bit registers contained in one of M words shares information and transmits a vector of data including an element of the selected word of data contributed by the 1 bit register contained in the one of M words.

6. The integrated M by N bit counter of claim 1, wherein the M by N register receives a 1 by M select indication to select a row of words from among several words maintained in the M by N register.

7. The integrated M by N bit counter of claim 1, wherein the N bit counter shares data stored in the M by N register, and the N-bit counter receives a control clock signal and enable signal, and produces a one dimensional array counted out therefrom.

8. The integrated M by N bit counter of claim 6, wherein the N bit counter receives a reset signal resetting at least one data value in the N bit counter to zero.

9. An M by N bit counter, comprising:
   an N-bit counter comprising a serially connected plurality of M by 1-bit counters, each M by 1-bit counter comprising a register and having an enable control feature; and
   load/store control logic connecting one of M words, and further enabling register configuration of the N bit counter to include N storage registers of a selected one of M words;
   wherein the load/store logic provides clock signals to the serially connected plurality of M by 1-bit counters each having an enable control feature to enable sharing of data from at least one register;
   and further wherein the serially connected plurality of M by 1 bit counters receive word select signals selecting the desired word for data sharing.

10. The M by N bit counter of claim 9, wherein each M by 1-bit counter comprises an M-bit store configured to share data across M access lines.

11. The M by N bit counter of claim 9, wherein each M by 1-bit counter shares information and transmits a vector of data including an element of the selected word of data contributed by the M by 1 bit counter.

12. The M by N bit counter of claim 9, wherein each M by 1-bit counter receives a series enable signal, the series enable signal enabling transmission of a vector of data including an element of the selected word of data.

13. The M by N bit counter of claim 9, wherein a word selected using the M by 1-bit counter causes the M by 1-bit counter to count at least one bit from an N-bit store and pass a vector including the at least one bit.

14. The M by N bit counter of claim 9, further comprising a count in mechanism configured to provide a count in to a first M by 1-bit counter.

15. An array arrangement for controlling a plurality of independently controllable circuits, comprising:
   an M by N register comprising a set of M selectable words, each selectable word comprising a set of 1 bit registers, said M by N register configured to store and receive an M by 1-bit selection of data selectable from the M by N register;
   an N bit counter configured to count data selected using the M by 1-bit selection; and
   a control mechanism configured to include each M by 1 bit register into a serial N bit counter.

16. The array arrangement of claim 15, wherein the control mechanism combines the 1 bit data registers of the N bit counter with data storage registers of each of M words stored in the M by N bit counter.

17. The array arrangement of claim 15, wherein the N bit counter comprises a plurality of serially connected N M by 1 bit counters with enable control selectively enabled to count data selected using the M by 1 bit counter.

18. The array arrangement of claim 17, wherein each M by 1 bit counter comprises a single bit M word series enabled synchronous counter having N bit store elements sharing data across M access lines.

19. The array arrangement of claim 17, wherein the each M by 1 bit counter shares data with selected storage elements and transmits a vector quantity having at least one bit of data selected using the M by 1 bit selection.

20. The array arrangement of claim 15, further comprising load/store logic used to selectively count out selected data using at least one of a plurality of N by 1 bit counters.

21. The array arrangement of claim 15, wherein the M by N register receives a 1 of M select indication to select a row of words from among several words maintained in the M by N register.

22. The array arrangement of claim 15, wherein the N bit counter shares data from the M by N register, and the N-bit counter receives a control clock signal and enable signal, and produces a one dimensional array counted out therefrom.

* * * * *